United States Patent [19]

Glavish et al.

[11] Patent Number: 4,667,111

[45] Date of Patent: May 19, 1987

[54] ACCELERATOR FOR ION IMPLANTATION

[75] Inventors: H. F. Glavish, Redwood City, Calif.; A. S. Denholm, Prides Crossing; G. K. Simcox, Lexington, both of Mass.

[73] Assignee: Eaton Corporation, Cleveland, Ohio

[21] Appl. No.: 735,326

[22] Filed: May 17, 1985

[51] Int. Cl.[4] .................... H01J 23/00; H01J 37/00
[52] U.S. Cl. ................... 250/492.2; 328/233; 313/360.1
[58] Field of Search ............ 250/492.2; 328/233; 313/359.1, 360.1

[56] References Cited

U.S. PATENT DOCUMENTS

| | | | |
|---|---|---|---|
| 2,769,093 | 10/1956 | Hare et al. | 313/360.1 |
| 3,317,846 | 5/1967 | Becker et al. | 313/360.1 |
| 3,725,997 | 4/1973 | Masuda | 313/359.1 |
| 3,761,828 | 9/1973 | Pollard | 328/233 |
| 4,211,954 | 7/1980 | Swenson | 315/5.41 |
| 4,383,180 | 5/1983 | Turner | 250/492.2 |
| 4,596,946 | 6/1986 | Pottier | 315/5.41 |

FOREIGN PATENT DOCUMENTS

| | | |
|---|---|---|
| 0094889 | 11/1983 | European Pat. Off. . |
| 663816 | 12/1951 | United Kingdom . |
| 672670 | 5/1952 | United Kingdom . |
| 766910 | 1/1957 | United Kingdom . |
| 844530 | 8/1960 | United Kingdom . |
| 1577186 | 10/1980 | United Kingdom . |

OTHER PUBLICATIONS

N. J. Barrett, Proc. Fourth Int. Con. on Ion Implantation: Equipment and Tech. eds. H. Ryssel & H. Glawischnig, Springer-Verlag, Berlin.

I Ben-Zvi, "Superconducting Linacs Used with Tandems" Nuc. Inst. & Methods in Physics Research 220 (1984) 177.

T. P. Wangler & R. H. Stokes "The Radio-Frequence Quadrupole Linear Accelerator" IEEE Trans. Nuc. Sci. NS-28, No. 2, 1981.

Primary Examiner—Bruce C. Anderson
Attorney, Agent, or Firm—Watts, Hoffmann, Fisher & Heinke

[57] ABSTRACT

A radio frequency (rf) ion accelerator. A beam of ions enters the accelerator with a low initial velocity. Ions are accelerated to energies on the order of 1 mev per charge state for use in deep ion implantation of semiconductor materials. The accelerator is constructed from multiple stages or cells with each cell including an accelerating electrode coupled to an rf resonant tank circuit. The phase of the tank circuit oscillation is controlled to take into account the mass, charge, and initial velocity of the ion. After traversing the multiple cells, a focused beam of ions is directed to a workpiece.

17 Claims, 9 Drawing Figures

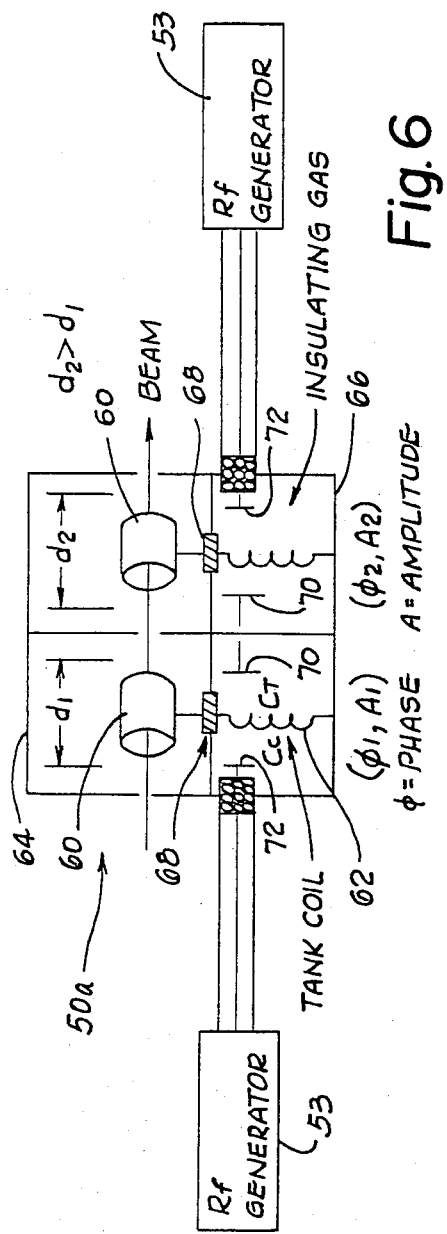
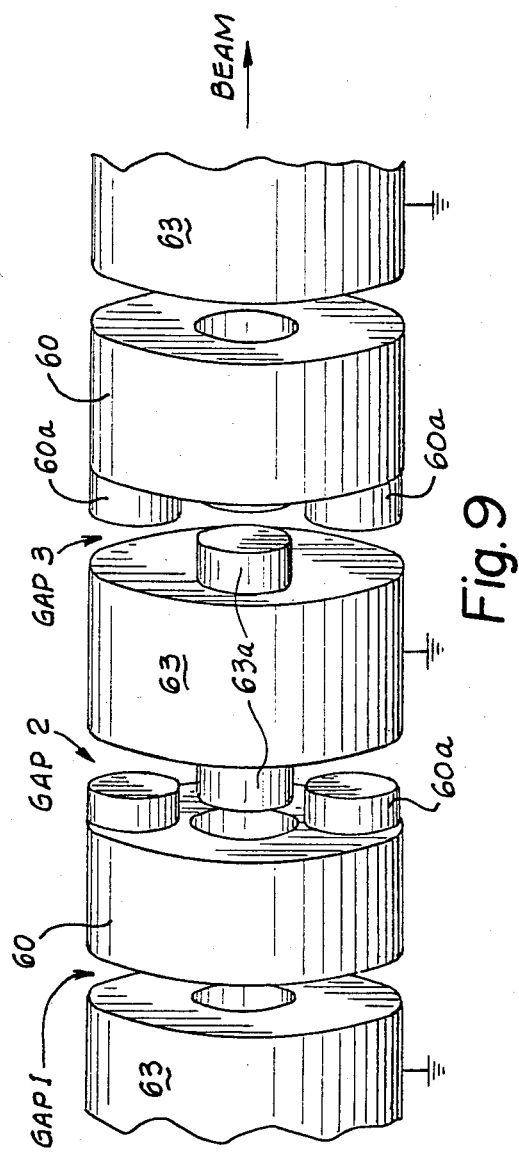
Fig. 6
Fig. 9

ACCELERATOR FOR ION IMPLANTATION

TECHNICAL FIELD

The present invention relates to Ion Implantation generally, and more specifically concerns a radio frequency ion accelerator.

BACKGROUND ART

Use of ion beams for treating workpieces is known in the prior art. Charged ions are accelerated to a velocity and focused to impinge upon a workpiece. This procedure can be used to harden materials and has been utilized for doping semi-conductor substrates. In one semi-conductor application, a focused beam of ions is directed along a controlled path to impinge upon semi-conductor wafers. The wafers are mounted to a support that can be rotated and translated. Controlled combinations of these movements cause a specific concentration of ion doping of the semi-conductor wafers.

Two prior art patents assigned to the assignee of the present invention disclose apparatus for use in ion implantation of semi-conductor materials. A first patent to Ryding (U.S. Pat. No. 4,234,797) entitled "Treating Workpieces With Beams" discloses a control mechanism for achieving uniform ion doping of semi-conductor substrates. The Ryding apparatus includes a beam neutralizer to control charge build up on the semi-conductor wafers. A second patent to Benveniste (U.S. Pat. No. 4,419,584) entitled "Treating Workpiece With Beams" discloses apparatus for controlling the temperature of a workpiece treating system specifically used for semi-conductor ion doping. The subject matter of these two prior art patents as specifically incorporated herein by reference.

Ion beams used with these treatment systems are accelerated with a static electric field generated by a direct current potential applied to an accelerating electrode. As is known, a charged particle (ion) experiencing a uniform electric field is accelerated by a force proportional to the charge on the particle times the field strength that particle experiences. The final velocity achievable through static field acceleration of a particle can be increased by either increasing the path through which the particle accelerates or increasing the field strength the particle experiences.

To achieve the ion energies necessary for beam implantation, the accelerating potential must be many thousands of volts. Energies up to 2 million electron volts are desirable for deep ion implantation of semi-conductor material. At these extremely high voltages, use of a direct current accelerating potential becomes difficult and complicated. At any voltage above 100 kilovolts, high direct current voltages must be electrically isolated from other components of the beam treatment system such as the ion source, gas handling and vacuum systems, control electronics, and beam analyzing magnet.

These prior art devices are also limited since the accelerated beam is at different dc voltage than the injected beam, the difference being the accelerating voltage. Alternately, the accelerated beam is at the same dc voltage as the injected beam but the charge state is changed in sign (and possibly magnitude) during acceleration which greatly limits the beam current.

Beam treatment apparatus must be flexible if it is to be used to accelerate different atomic number ions. It is desirable, for example, that the same accelerating, focusing, and analyzing equipment be suitable for different ions. This equipment should have pratical simplicity and modest dimensions and be produced at a reasonable cost if the ion implantation system is to have commercial viability.

DISCLOSURE OF THE INVENTION

The present particle accelerator produces particle accelerating electric fields which vary periodically with time. The phase of these fields is adjustable to accommodate different atomic number particles as well as particles having different initial conditions, i.e. speeds with which they enter the particle accelerator. This is accomplished in a straightforward way, compared with the technical difficulties needed to accelerate particles using static d.c. fields, yet produces high energies suitable for deep ion implantation.

The ion implantation apparatus of the invention includes a source to produce a beam of charged ions moving at an initial velocity. A radio frequency accelerator has a sequence of electrodes that create an alternating electric field to further accelerate the ions. Each electrode is electrically coupled to an energizing circuit which applies alternating current potential having a specified frequency, amplitude, and phase to accelerate the ions entering the accelerator. After the ions are accelerated, a pulsed beam of those ions can be directed to a workpiece.

This invention is of major importance in ion implantation of semiconductors and other material. The radio frequency accelerator can accelerate heavy atomic particles possessing a low charge to mass ratio from an energy of as low as 80 keV per electronic charge state to energies up to and exceeding 1 meV per electronic charge state. A single configuration of the invention is capable of achieving variable energy acceleration for a broad range of different particle species, with a charge to mass ratio (q/A) that can spread over more than a decade range (10 to 1). For example, a single configuration can accelerate any of the following typical ions used in semiconductor implantation:

| Boron | $B^{2+}$ (q/A = 1/5), $B^+$ |
|---|---|
| Phosphorous | $P^{2+}$, $P^+$ |
| Arsenic | $As^{2+}$, $As^+$ |
| Antimony | $Sb^{2+}$ (q/A = 1/60) |

Unlike prior art accelerators, the invention offers at once all four of the following features:

(a) low injection energy compared with the final energy after acceleration, (b) low charge to mass ratios, for example down to q/A=1/130, and (c) a broad range of charge to mass ratios, for example q/A=1/10 to 1/130 or q/A−1/5 to 1/60.

(d) a continuously variable energy from zero to a specified maximum,

A preferred accelerator defines a two gap structure wherein a ring-like or annular energized electrode is bounded by grounded electrodes on either side. The timing of the oscillating electric field is chosen such that as a particle moves through a first gap between a first grounded electrode to the accelerating electrode, a first acceleration field is encountered. As the particle passes through the accelerating electrode and moves into a second gap between that electrode and the second grounded electrode, the electric field switches in polarity so that the ion is again accelerated.

Radial focusing is applied to the ions as they are accelerated to prevent them from continuously diverging outwards from a center axis path of travel. This radial focusing prevents the ions from eventually striking inner surfaces of the electrodes and becoming lost forever from the main beam.

A preferred design accelerates the ions in stages. Multiple accelerating electrodes are staggered with grounded electrodes in evacuated accelerating chambers. The phase of the electric field generated at each electrode is varied to accommodate ions of various charge to mass ratios (q/A). In addition, both the phase and amplitude of each electrode can be varied to provide a continuous range of final energies.

An electrode energizing circuit includes a tank circuit having an inductor and capacitor whose values dictate the frequency of oscillation. A radio frequency generator coupled to the tank circuit energizes the tank circuit at a controlled frequency matching the resonant frequency of the tank circuit. The stray capacitance to ground of the inductor adds to the capacitance of the tank circuit. This capacitance is controlled by changing a spacing between the inductor and a grounding plate in close proximity to the inductor. The tank coil is mounted in a separate cavity from the evacuated accelerating chamber.

In one embodiment, the voltage at the accelerating electrode can be varied from 0 to 150 kilovolts and the frequency of oscillation of the tank circuit can be selected to be in the range of 3 to 30 megahertz. By staggering accelerating and grounded electrodes along a multi-stage acceleration path, ions are accelerated to energies of over one million electron volts per charge state.

One aspect of the invention is, therefore, a safe, structurally simple particle accelerator for use in ion beam treatment of a workpiece specifically suited for deep ion implantation of semiconductor materials. This and other objects, advantages, and features of the invention will become better understood when a detailed description of a preferred embodiment of the invention as described in conjunction with the accompanying drawings.

BRIEF DESCRIPTION OF THE DRAWINGS

FIG. 6 is a schematic of a module having two accelerating electrodes with separate tank circuits and radio frequency generators;

FIG. 9 is a perspective view of an alternate electrode configuration used for radial focusing of ions.

BEST MODE FOR CARRYING OUT THE INVENTION

Figure 1:
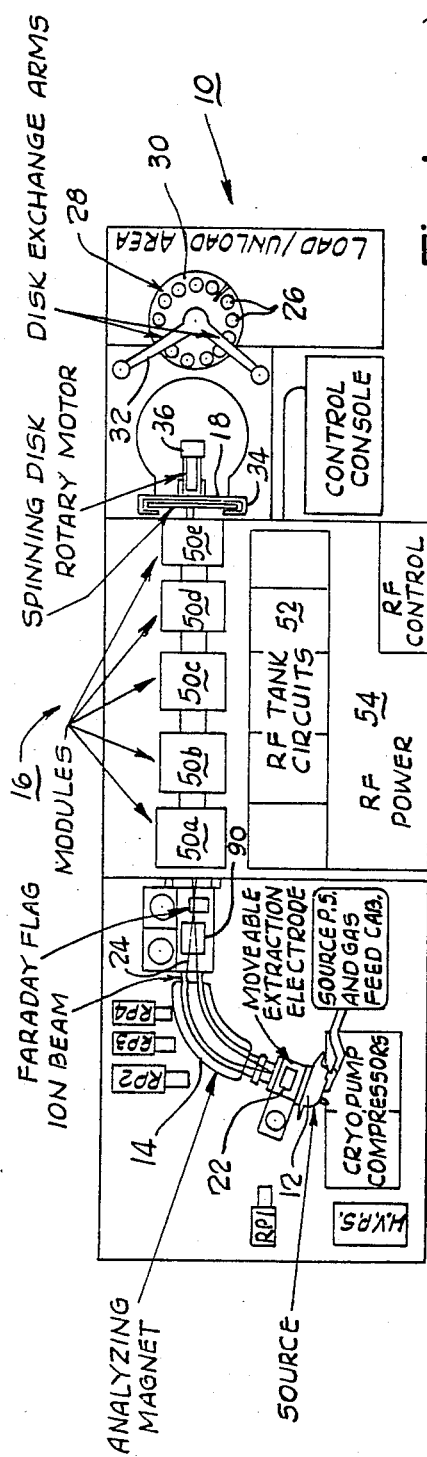
FIG. 1 is a schematic of an ion implantation system including a radio frequency ion accelerator.

Turning now to the drawings, FIG. 1 shows an ion implantation system 10 for directing high energy ions at a target. The system includes an ion source 12, an analyzing magnet 14, a high energy beam accelerator 16 and an implantation station 18.

Ions from the source are accelerated to an energy of from between 20 kev and 80 kev by a static field producing electrode 22, then resolved by the magnet 14 into a uniform ion beam 24. A buncher 90 pre bunches the beam prior to injection.

Figure 7:
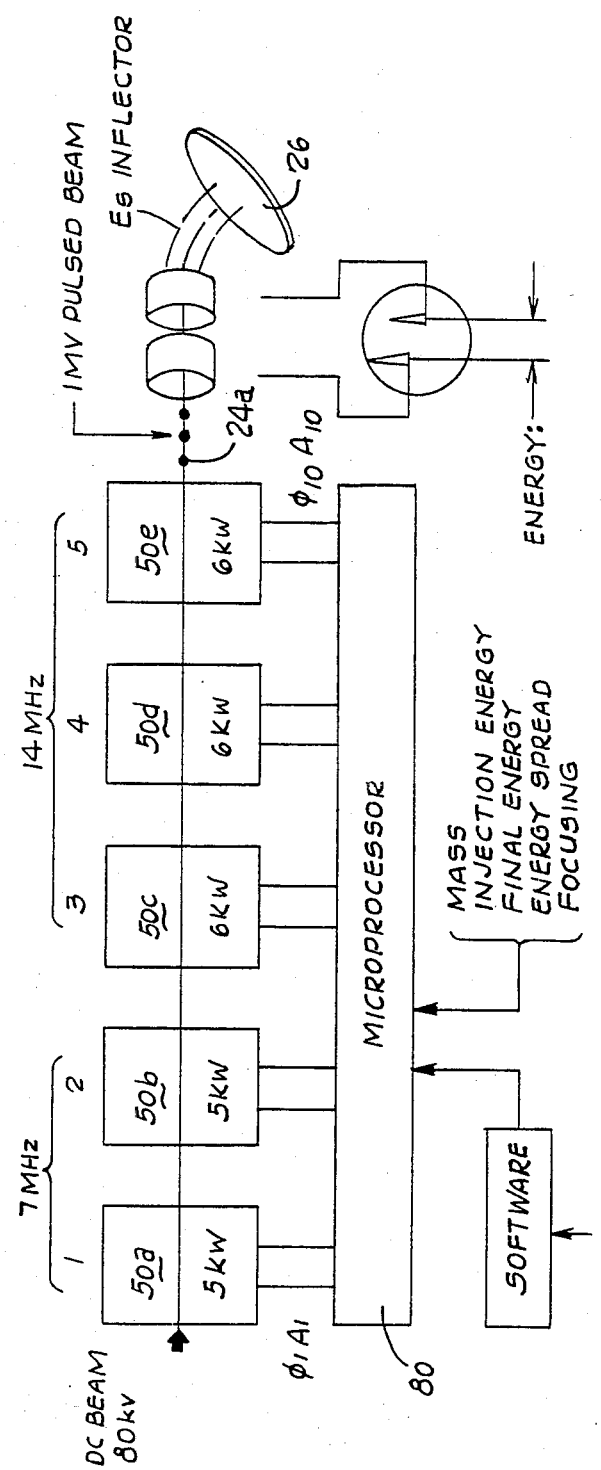
FIG. 7 is a schematic of five successive modules for accelerating ions to energies for deep ion implantation.

The accelerator 16 receives the beam 24 and accelerates ion to much higher energies ranging from 200 kev to 2 Mev. High energy ions leave the accelerator 16 in focused packets or bunches 24a (FIG. 7). This anial focusing effect is caused by radio frequency (rf) electric fields used in accelerating the ions.

The implantation station 18 shown in FIG. 1 is specifically arranged for ion implantation of semiconductor wafers 26. At a load/unload station 28, a technician or an automated device positions the wafers 26 about the periphery of a mounting disk 30. The disk 30 is then moved via disk exchange arms 32 to a vacuum process chamber 34. The disk and wafers are tilted up to an orientation to cause highly accelerated ions to impinge upon the wafers 26. A motor 36 rotates the disk 30 and a separate drive (not shown) translates both the motor 36 and disk 30 so the ions sweep across the rotating disk. Control of motor rotation and translation of the disk 30 with respect to the bunched ion beam 24a allow doping concentration to be controlled and in particular allow a uniform implantation concentration to be achieved.

FIGS. 2–9 relate to specifics of the ion accelerator 16. The accelerator 16 includes a sequence of five modules 50a–e that act in turn upon ions entering the accelerator 16. The modules are coupled to resonant circuits 52 driven by rf power circuits 54 that energize the resonant circuits 52. In the disclosed embodiment of the invention, each of the five modules 50a–e includes two accelerating electrodes 60.

Figure 2:
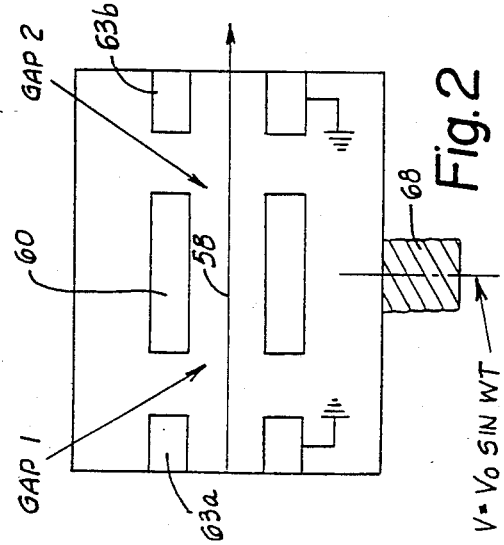
FIG. 2 is a schematic of an accelerating electrode of the ion accelerator.

A schematic representation of one electrode 60 of one module 50a is shown in FIG. 2. This electrode 60 defines a center path of travel 58 along which the ions move. On either side of the accelerating electrode 60 are positioned two grounded potential electrodes 63a, 63b. A region between the accelerating electrode 60 and a first grounded electrode 63a is designated "gap 1" and a region between the accelerating electrode 60 and a second grounded electrode 63b is designated "gap 2". By suitable rf frequency energization of the accelerating electrode 60 electrical fields are created within gap 1 and gap 2 that accelerate ions as they pass through the two gaps.

A broad range of charge to mass ratios (q/A) can be accelerated by independently adjusting the rf field phase of successive accelerating electrodes in the modules 50a–50c. This control insures a particle bunch arrives at each gap at a time in the rf cycle so that the electric field accelerates the ion.

Figure 4:
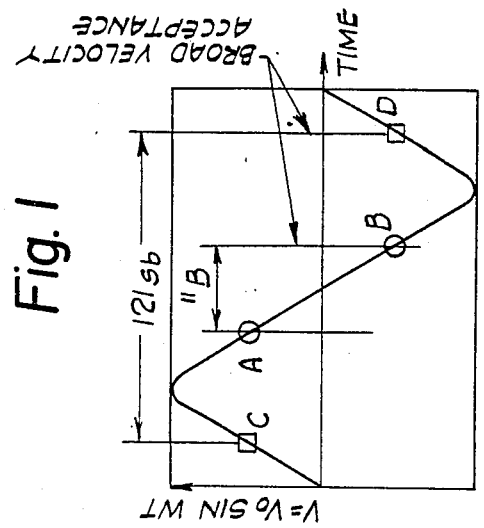
FIGS. 3 and 4 are graphs depicting electric field distribution and particle time of flight for two accelerating gaps in the vicinity of the FIG. 2 accelerating electrode.
Figure 3:
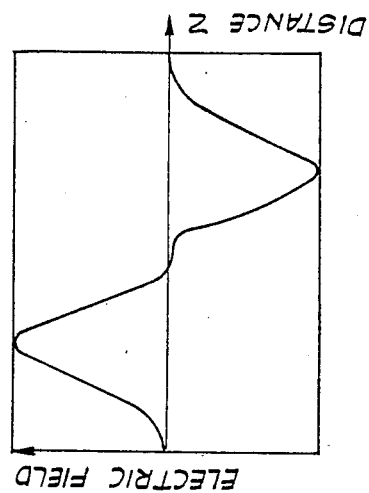

A typical axial electric field distribution in the vicinity of the electrode 60 of FIG. 2 is shown in FIG. 3. The time varying voltage on the electrode 60 and hence also the time variation of the accelerating field is shown in FIG. 4. Positive ions are accelerated across "gap 1" when the voltage is negative. As the particle passes through the electrode 60 the voltage reverses and further acceleration occurs in "gap 2".

The time of flight through the electrode 60, determined by particle velocity and electrode length, is thus related to the frequency of the rf field. By appropriate choice of module dmension and frequency of electrode energization both light and heavy particles can be successfully accelerated as shown for the cases of boron and antimony in FIG. 4. The light boron ion, moving faster, spends less time in the region of the electrode 60. The boron ion is in gap 1 at point A, and in gap 2 at point B. The voltage on the electrode 60 is decreasing at both points A and B and the boron ion experiences a net acceleration. The heavy, slower antimony ion is in gap 1 at C and in gap 2 at D. The voltage at points C and D is increasing, yet the electric field again produces a net acceleration. In fact, the boron and antimony ions experience approximately the same acceleration, approximately 50% of the energy of the peak accelerating voltage on the electrode 60.

To obtain high energy acceleration in practical dimensions requires the rf voltage be high. The simplest method of obtaining this high voltage is by exciting a high frequency resonant (tank) circuit 52 (FIG. 5) which is tuned to the desired frequency with an rf generator 53. In this circuit, a capacitance ($C_s$) is essentially the stray capacitance of the high voltage acceleration electrode to ground and the inductance (L) is obtained from a large single layer coil 62 of suitable dimensions. Inductance and capacitance are influenced by proximity effects which have to be included in design considerations. A certain minimum capacitance is associated with the high voltage acceleration electrode which determines the coil parameters for a required frequency. A resonant loop (L and $C_s$) has losses represented by $R_L$ and can be excited via a very small coupling capacitance ($C_c$).

The coil 62 is physically relatively large and has associated with it both turning and coupling devices. The coil system is significantly greater in volume than the acceleration electrode 60 which must be in an evacuated chamber 64. Since it is desirable to keep the vacuum volume as small as possible for outgassing and contamination reasons, and since most of the losses in the tank circuit are associated with the coil 62 and the coil system is located in an environment which cools better than vacuum. The coil environment should have a low dielectric constant (preferably 1) to limit its self capacitance, and the environment should also have low rf loss and good high voltage properties. To meet these requirements the coil 62 is mounted in a chamber 66 containing an electronegative gas such as sulphur hexafluoride. A high voltage rf feedthrough 68 is required to isolate the coil system gaseous volume from the vacuum chamber 64 (FIG. 6).

Figure 5:
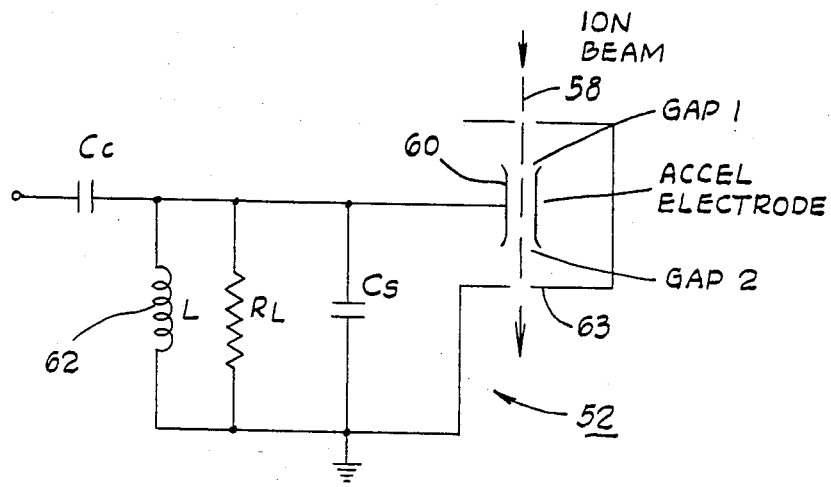
FIG. 5 is a schematic of a tank circuit coupled to an accelerating electrode for energizing that electrode.

Based on the velocity profile of the range of ions to be accelerated suitable cavity geometries and corresponding operating frequencies can be determined. It is important that the high Q resonant circuit 52 be kept in tune with this frequency and consequently a small amount of variable (tuning) capacitance is required for precise adjustment of the resonant frequency and to maintain this frequency while the coil, for example, heats up and changes dimension under load. This tuning can be achieved by a movable plate 70 at ground potential which is driven by a control motor (not shown) to modify the stray capacitance to ground (FIG. 5, $C_T$). The position of the plate and thus $C_T$ is adjusted by a feedback loop to maintain the desired resonant frequency.

With regard to the excitation power for driving the resonant circuit, it is desirable that the input impedance of the tank circuit should be close to 50Ω, and resistive, because of the commercial standardization of that impedance for amplifiers, cables, connectors, etc. Fortunately, it is possible to select a practical value for $C_C$ (FIG. 5) which provides a 50Ω input condition. This capacitance ($C_C$) is very small, as is the required tuning capacitance ($C_T$), and can be achieved geometrically by using a simple plate 72 spaced a few centimeters from the high voltage (acceleration electrode) end of the coil 62 (FIG. 6). A control motor drive on this plate uses feedback to control the coupling capacitance to maintain the 50Ω matching impedance condition.

As the ion beam moves through the accelerating cavities, the increasing velocity requires that the lengths of the electrodes 60 become longer to accomplish correct phasing between gap 1 and gap 2 (FIG. 2). After several stages of acceleration, it is desirable to increase the frequency to limit the electrode lengths. The accelerating frequencies have to remain in step so that the higher frequency (or frequencies) have to be multiples of the initial frequency.

FIG. 7 shows the overall concept for a 1 Mev per charge state accelerator with 5 modules, each module consisting of two acceleration electrodes (i.e., 4 gaps). The phasing of each cavity is selected according to the charge to mass ratio (q/A) of the ion to be accelerated and are programmed into a microprocessor controller 80.

Ions with more than one electronic charge can also be accelerated. An accelerator structure providing 1 Mev with singly charged ions provides 2 Mev with doubly charged ions. For many applications in this megavolt range relatively modest beam currents are adequate, in fact, power density in the material being treated may require that low beam currents be used. Since quite large yields of doubly charged ions can be obtained from some ion sources, the capability of accelerating such ions greatly increases the usefulness of the invention. The microprocessor software is programmed to handle both the singly and doubly charged situation.

In choosing the parameters for the accelerator 16 the maximum gap acceleration voltage is of prime importantance. The higher this voltage, the fewer modules are required to achieve a specific final energy. However, the total rf power requirements increases roughly with the square of the gap voltage, and so there is a trade-off between cost of modules (and machine length) vs. the gap acceleration voltage. Value analysis for different gap voltages indicate that a maximum voltage of 80 KV peak is close to the optimum for most applications, although designs can be made within ±50% of that value. An 80 KV gap voltage with a well designed evacuated chamber and resonator circuit requires less than 3 KW, which is within the range of currently available solid state rf power amplifers.

The ions in the injected beam, in general, have a radial component of velocity. Typically, ions may be traveling at up to 0.04 radians relative to the central axis.

Figure 8:
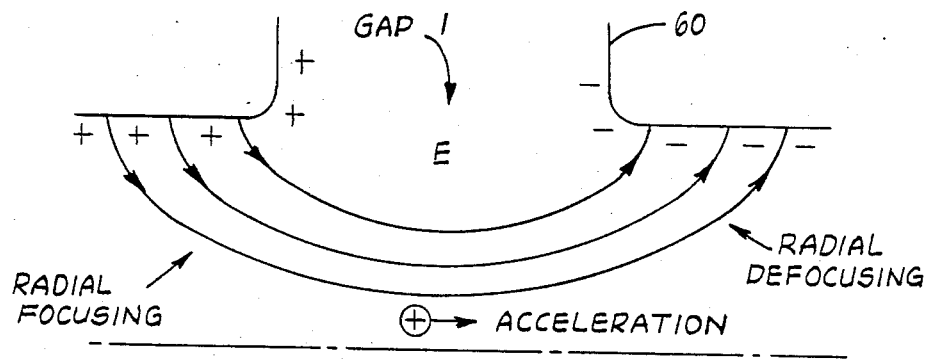
FIG. 8 is an enlarged view of the FIG. 2 cell showing an electric field distribution in an accelerating gap.
Figure 8:
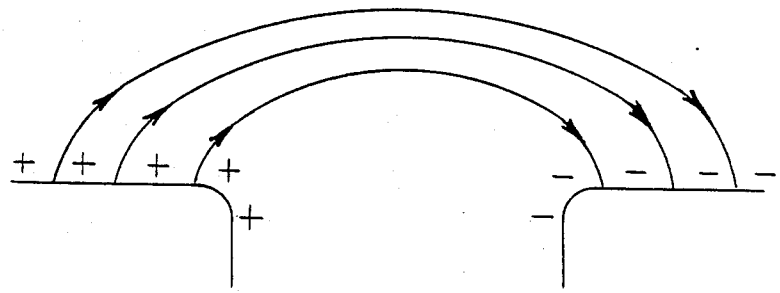

In each accelerating gap, the electric field lines are typically as shown in FIG. 8. They produce radial focusing in the first half of the gap and radial defocusing in the second half of the gap. If the gap is operating at a phase which keeps the particles bunched in the axial direction, then more often than not, the electric field must still be increasing in magnitude, through its rf cycle, while a particle is passing through the gap. Consequently, the electric radial defocusing forces in the second half of the gap are stronger than the radial focusing forces in the first half of the gap. Thus, the net result is an overall radial defocusing.

The radial defocusing is compensated for by:

(1) using magnetic quadrupoles at various positions along the length of the accelerator 16;

(2) Alternating the sign of the synchronous phase angle of the accelerating gaps along the length of the accelerator 16. This can simultaneously maintain axial and radial stable motion at least over a narrow range of the rf phase, and (3) using electrostatic quadrupoles, since the beam energies are quite low and electrostatic quadrupoles can be made compact.

An additional radial focusing method incorporates a quadrupole field in the region of the accelerating gaps. Electrodes 60, 63 having cylindrical azimuthal variations 60a, 63a in their profile are shown in FIG. 9. These electrodes 60, 63 produce rf quadrupole focusing fields in Gap 2 and Gap 3 that counteract the defocusing effect shown in FIG. 8.

The present invention has been described with a degree of particularity. It is the intent, however, that the invention include all modifications or alterations of the disclosed preferred embodiment falling within the spirit or scope of the appended claims.

What is claimed is:

1. Ion implantation apparatus comprising:
    an ion source for directing charged ions having an initial energy along a travel path;
    an ion accelerator including a plurality of spaced apart accelerating electrodes which, when energized, create an alternating electric field to accelerate the ions in stages through a plurality of accelerating gaps between electrodes to a second energy;
    energizing means coupled to the ion accelerator for applying an alternating accelerating potential of a specific frequency and amplitude to each accelerating electrode of the plurality of accelerating electrodes to accelerate the ions through said plurality of accelerating gaps;
    implantation means for positioning a workpiece so that charged ions accelerated to the second energy impact said workpiece; and
    control means coupled to the energizing means to control the relative amplitude and phase of the electric fields in the accelerating gaps.

2. The apparatus of claim 1 wherein the energizing means comprises a plurality of tank circuits for controlling the amplitude and frequency of the accelerating potential applied to each of said plurality of electrodes.

3. The apparatus of claim 1 wherein the accelerating electrodes comprise generally annular structures, and where at least some of the annular structures have protrusions which, when energized, focus the ions along the travel path by creating a quadrupole field component at the accelerating region.

4. Ion implant apparatus where ions with different atomic numbers are accelerated to a desired energy for ion treatment of a workpiece, said apparatus comprising:
    means for directing a beam of ions along an initial trajectory;
    a plurality of spaced electrodes aligned along a direction of the initial trajectory and configured to define an acceleration region for said ions wherein each electrode is of a generally cylindrical shape spaced from adjacent electrodes to define accelerating gaps through which the ions accelerate;
    energizing means for energizing alternate electrodes with an alternating current signal to create an alternating electric field in said accelerating gaps, said energizing means including a plurality of resonant energizing circuits, where each resonant energizing circuit is coupled to one of said alternate electrodes and has a resonant frequency that is adjustable in phase and amplitude to tune each of said alternate electrodes for accelerating a specific ion; and
    means to position a workpiece in the path of said ions subsequent to acceleration by said electrodes.

5. The accelerator of claim 4 wherein each resonant energizing circuit includes an inductive coil coupled between an associated electrode and ground for tuning said resonant energizing circuit a specific resonant frequency.

6. The accelerator of claim 5 wherein the electrodes are positioned in an evacuated chamber and the resonant energizing circuits are outside the evacuated chamber in an insulating gas.

7. An ion implantation accelerator for accelerating charged ions to a desired energy for ion implantation of a workpiece comprising a plurality of accelerating electrodes arranged in series to define an acceleration path having an entrance and an exit, each electrode maintained at either a constant or an alternating potential with each constant potential electrode separated from an associated alternating potential accelerating electrode by an associated accelerating gap; energizing means for applying an alternating potential of a controlled frequency and amplitude to each accelerating electrode to create alternating electric fields in the gaps in a co-ordinated manner to accelerate ions through said accelerator, and control means for individually adjusting the phase of an electric field in successive accelerating gaps from the entrance to the exit based upon a charge to mass ratio of the charged ions.

8. The accelerator of claim 7 where the energizing means comprises a tank circuit for each accelerating electrode for adjusting the phase and amplitude of the alternating potential applied to ach alternating potential electrode.

9. The accelerator of claim 9 wherein a peak maximum accelerating potential is in a range of from 30-150 k volts and said frequency is in a range of from 3 to 30 megahertz.

10. A method for ion implantation of a workpiece comprising the steps of:
providing a beam of ions moving along an initial trajectory to enter a first region, said ions having a certain charge to mass ratio;
creating an oscillating electric field having an adjustable accelerating frequency and a controlled amplitude in the first region to accelerate ions through the first region toward a second region;
creating an oscillating electric field at the accelerating frequency and of a controlled amplitude in the second region to accelerate ions through the second region;
coordinating a phase of the oscillating field in said first and second regions based upon the charge to mass ratio of said ions to produce a desired increase in ion energy as the ion leaves the second region; and
directing ions leaving the second region to a workpiece for ion implantation of said workpiece.

11. The method of claim 12 wherein the oscillating electric field has a quadrupole field component that focuses ions along a predetermined travel path.

12. The method of claim 12 wherein the frequency of the electric field oscillations is controlled by tuning a tank circuit having inductive and capacitive components which determine a resonant frequency.

13. The method of claim 12 where the tank circuit is tuned by changing the capacitance of the tank circuit.

14. The method of claim 13 where the tank circuit is energized by capacitive coupling of an power source to a moveable plate positioned in relation to the inductive components of the tank circuit and the input impedance to the plate is controlled to match the impedance of the power source.

15. The ion implantation apparatus of claim 2 wherein the energizing means tank circuits have adjustable reasonant frequencies.

16. The method of claim 12 wherein additional oscillating electric fields of controlled phase and amplitude are created in regions subsequent to said first and second regions for further accelerating said ions and wherein a frequency of said additional oscillating electric fields is adjusted to have a frequency that is a multiple of the accelerating frequency in the first and second regions.

17. A method for ion implantation of a workpiece comprising the steps of:
directing charged ions having an initial energy along a travel path;
positioning a plurality of accelerating electrodes along the travel path at spaced apart intervals to define a plurality of accelerating gaps;
applying an alternating accelerating potential of a specific frequency and amplitude to each accelerating electrode of the plurality of accelerating electrodes to accelerate the ions in stages through said plurality of accelerating gaps to a second energy;
controlling a relative phase of the electric fields in the accelerating gaps; and
positioning a workpiece so that charged ions accelerated to the second energy impact said workpiece.

* * * * *

UNITED STATES PATENT AND TRADEMARK OFFICE
CERTIFICATE OF CORRECTION

PATENT NO. : 4,667,111
DATED : May 19, 1987
INVENTOR(S) : H.F. Glavish et al.

It is certified that error appears in the above-identified patent and that said Letters Patent is hereby corrected as shown below:

In the Specification:

Column 2, line 40, "material" should read --materials--.
Column 4, line 33, "ion" should read --ions--.
Column 5, line 28, "dmension" should --dimension--;
         line 65, "turning" should read -- tuning--.
Column 6, line 3, "and" should be deleted.

In the Claims:

Claim 8, line 4, "ach" should read --each--.
Claim 9, line 1, "9" should read --7--.
Claim 11, line 1, "12" should read --10--.
Claim 12, line 1, "12" should read --10--.
Claim 16, line 1, "12" should read --10--.

Signed and Sealed this

Twentieth Day of October, 1987

Attest:

DONALD J. QUIGG

Attesting Officer

Commissioner of Patents and Trademarks

(12) REEXAMINATION CERTIFICATE (4306th)
United States Patent
Glavish et al.

(10) Number: US 4,667,111 C1
(45) Certificate Issued: Apr. 10, 2001

(54) ACCELERATOR FOR ION IMPLANTATION

(75) Inventors: H. F. Glavish, Redwood City, CA (US); A. S. Denholm, Prides Crossing; G. K. Simcox, Lexington, both of MA (US)

(73) Assignee: Eaton Corporation, Cleveland, OH (US)

Reexamination Requests:
No. 90/005,336, Apr. 22, 1999
No. 90/005,731, May 18, 2000

Reexamination Certificate for:
Patent No.: 4,667,111
Issued: May 19, 1987
Appl. No.: 06/735,326
Filed: May 17, 1985

Certificate of Correction issued Oct. 20, 1987.

(51) Int. Cl.$^7$ .............................. H01J 23/00; H01J 37/00; H01J 37/317
(52) U.S. Cl. .............................. 250/492.2; 250/492.21; 315/500; 315/505; 315/506; 313/359.1
(58) Field of Search ............................. 250/492.2, 492.21; 315/500, 505, 506; 313/359.1

(56) References Cited

U.S. PATENT DOCUMENTS

| | | |
|---|---|---|
| 2,787,564 | 4/1957 | Shockley. |
| 4,801,847 | 1/1989 | Sakudo et al. .......................... 315/5.41 |

FOREIGN PATENT DOCUMENTS

| | | |
|---|---|---|
| 38-9200 | 6/1963 | (JP). |
| 60-121665 | 6/1985 | (JP). |

OTHER PUBLICATIONS

J.P. Wurm, Heavy Ion Post–Acceleration On The Heidelberg MP Tandem Accelerator, May 1976.
K. Bethge, et al., Upgrading of Single Stage Accelerators, Oct. 1976, pp. 461–468.
G. Ryding, Evolution And Performance Of The Nova NV–10 Predep Implanter, 1982, 99 319–42.

P. Lapostolle, New Heavy Ion Accelerators, Aug. 1983.
R. L. Witkover. *Proceedings Of The 1979 Linear Accelerator Conference*, Brookhaven National Laboratory Associated Universities, Inc., Upton, New York 11973, Sep. 10–14, 1979, pp. 28–31.
M. Odera and Y. Chiba, *Proceedings of the 4$^{th}$ Symposium on Accelerator Science and Technology*, Institute of Physical and Chemical Research (Riken) Saitama, Japan, Nov. 24–26, 1982, pp. 53–54, 115–116 and 249–250.
M. Odera et al., *Status of Operation Of The Variable Frerquency Heavy–Ion Linac, Rilacc*, Nov. 1992, pp. 53–54.
M. Odera, *Report On Frequency Tunable RILAC*, May 1984, pp. 36–40.
A. Schempp et al., *Properties Of Spiral Loaded Cavities*, Jan. 1976, pp. 409–414.
D. H. Sloan et al., *The Production Of Heavy High Speed Ions Without The Use of High Voltages*, Oct., 1931, pp. 2021–2032.
D. Boussard, *Radiofrequency Focusing In Heavy Ion Linear Accelerators*, 1971, pp. 1073–1087.
L.M. Bollinger et al., *Concept Of A Superconducting Linac For Low–Velocity Ions*, 1984, pp. 217–219.
D.D. Armstrong, *Experimental Study Of Spiral Reasonators For Acceleration Of Low Velocity Ions*, Nov. 1984, pp. 175–182.
Dipankar Parmanik, *MeV Implantation For Silicon Device Fabrication*, May 1984, pp. 211–216.

(List continued on next page.)

Primary Examiner—Teresa M. Arroyo

(57) ABSTRACT

A radio frequency (rf) ion accelerator. A beam of ions enters the accelerator with a low initial velocity. Ions are accelerated to energies on the order of 1 mev per charge state for use in deep ion implantation of semiconductor materials. The accelerator is constructed from multiple stages or cells with each cell including an accelerating electrode coupled to an rf resonant tank circuit. The phase of the tank circuit oscillation is controlled to take into account the mass, charge, and initial velocity of the ion. After traversing the multiple cells, a focused beam of ions is directed to a workpiece.

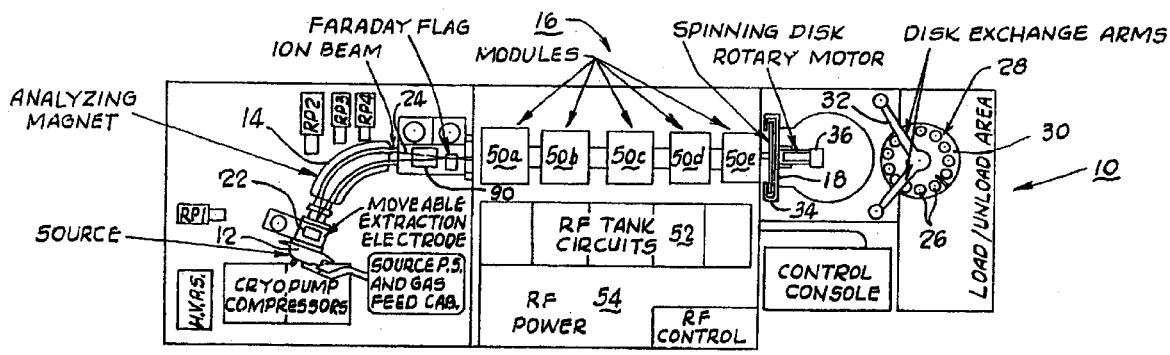

OTHER PUBLICATIONS

K. Bethge, *Applied Heavy Ion Research,* 1977, pp. 84–85.

Marshall R. Cleland, *Applications Of Linear Accelerators In Industry,* May 1974, pp. 496–500.

D. Bohne, *Heavy Ion Linear Accelerators,* 1969, pp. 1047–1071.

M. Blann, *Heavy Ion Accelerators Of The Future,* Nov. 1971, pp. 1–17.

E. Jaeschke, *Linac Postaccelerators For Tandem Machines,* 1984, pp. 24–30.

*The New IEEE Standard Dictionary Of Electrical And Electronics Terms,* Fifth Edition, Jan. 1993, p. 1337.

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claim 1 is confirmed.

Claims 2, 8 and 15 are cancelled.

Claims 3–7, 10 and 17 are determined to be patentable as amended.

Claims 9, 11–14 and 16, dependent on an amended claim, are determined to be patentable.

New claims 18–32 are added and determined to be patentable.

3. The apparatus of claim [1] *18* wherein the accelerating electrodes comprise generally annular structures, and where at least some of the annular structures have protrusions which *define the focusing means, which* when energized, focus the ions along the travel path by creating a quadrupole field component at [the] *an* accelerating region.

4. Ion implant apparatus where ions with different atomic numbers are accelerated to a desired energy for *automated* ion treatment of a *plurality of semiconductor wafer* workpiece*s*, said apparatus comprising:
   an ion source for creating ions;
   means for *accelerating the ions away from the ion source and* directing a beam of ions *having an initial energy* along an initial trajectory;
   an ion accelerator including:
   *I*) a plurality of spaced electrodes aligned along a direction of the initial trajectory and configured to define an acceleration region for said ions wherein each electrode is of a generally cylindrical shape spaced from adjacent electrodes to define accelerating gaps through which the ions accelerate; *and*
   *ii*) energizing means for energizing alternate electrodes with an alternating current signal to create an alternating electric field in said accelerating gaps, said energizing means including a plurality of resonant energizing circuits, where each resonant energizing circuit is coupled to one of said alternate electrodes and has a resonant frequency that is adjustable in phase and amplitude to tune each of said alternate electrodes for accelerating a specific ion *from the ion source to a second energy*; and
   an implantation station including *automated* means to position a workpiece *from the plurality of semiconductor wafer workpieces* in the path of said ions subsequent to acceleration *of the ions* by said electrodes *to the second energy.*

5. The accelerator of claim 4 wherein each resonant energizing circuit includes an inductive coil coupled between an associated electrode and ground for tuning said resonant energizing circuit *to* a specific resonant frequency.

6. The accelerator of claim 5 wherein the electrodes are positioned in an evacuated chamber and the resonant energizing circuits are outside the evacuated chamber in an insulating *electronegative* gas.

7. An ion implantation *apparatus comprising:*
   an ion source for creating ions;
   an electrode biased relative to the ion source at an electrostatic potential for directing a beam of the charged ions having an initial energy along a travel path away from the ion source;
   an accelerator for accelerating charged ions *having the initial energy* to a desired *second* energy for ion implantation of a *semiconductor wafer* workpiece comprising*:*
   *I*) a plurality of accelerating electrodes arranged in series to define an acceleration path having an entrance and an exit, each electrode maintained at either a constant or an alternating potential with each constant potential electrode separated from an associated alternating potential accelerating electrode by an associated accelerating gap;
   *ii*) energizing means for applying an alternating potential of a controlled frequency and amplitude to each accelerating electrode to create alternating electric fields in the gaps in a co-ordinated manner to accelerate ions through said accelerator, and
   *iii*) control means for individually adjusting the phase of an electric field in successive accelerating gaps from the entrance to the exit based upon a charge to mass ratio of the charged ions*; and*
   *an automated implantation station including a support that positions one or more than one semiconductor wafer workpiece within a process chamber so that charged ions accelerated to the second energy impact said one or more than one semiconductor wafer workpiece.*

10. A method for ion implantation of a *plurality of semiconductor wafer* workpieces comprising the steps of:
   providing ions at an ion source;
   *accelerating the ions from the ion source to a first energy;*
   mass analyzing the ions *and* providing a beam of ions *at the first energy* moving along an initial trajectory to enter a first region, said ions having a certain charge to mass ratio;
   creating an oscillating electric field having an [adjustable] *adjustably maintainable* accelerating frequency and a controlled amplitude in the first region to accelerate ions through the first region toward a second region;
   coordinating a phase of the oscillating field in said first and second regions based upon the charge to mass ratio of said ions to produce a desired increase in ion energy *to a second higher energy* as the ions leave[s] the second region; and
   *automatically moving one or more semiconductor wafer workpieces into an implantation station for ion implantation of said one or more workpieces;*
   directing ions leaving the second region to *impact* a semiconductor wafer workpiece *in the implantation station* for ion implantation of said *semiconductor wafer* workpiece.

17. A method for ion implantation of a *plurality of semiconductor wafer* workpieces comprising the steps of:
   *providing charged ions at an ion source;*
   *accelerating the ions from the ion source and* directing charged ions having a initial energy along a travel path;

positioning a plurality of accelerating electrodes along the travel path at spaced apart intervals to define a plurality of accelerating gaps;

applying an alternating accelerating potential of a specific frequency and *controlled* amplitude to each accelerating electrode of the plurality of accelerating electrodes to accelerate the ions in stages through said plurality of accelerating gaps to a second energy;

controlling a relative phase of the electric fields in the accelerating gaps; and positioning a *semiconductor wafer* workpiece *or a plurality of semiconductor wafer workpieces at an implantation station* so that charged ions accelerated to the second energy impact said *semiconductor wafer* workpiece *or workpieces*.

18. The ion implantation apparatus of claim 1 additionally comprising focusing means for creating a quadrupole field to focus the accelerated ions as they pass through the ion accelerator.

19. The ion implantation apparatus of claim 1 additionally comprising a mass analyzing means for selecting ions having a predetermined charge to mass ratio to an implantation travel path.

20. The ion implantation apparatus of claim 19 wherein the mass analyzing means comprises an analyzing magnet for selecting ions having the initial energy before said ions enter the accelerator.

21. The ion implantation apparatus of claim 20 wherein the analyzing magnet redirects the ions away from their initial travel path to the implantation travel path before the ions reach the accelerator.

22. The ion implantation apparatus of claim 1 wherein the implantation means includes a support for mounting a plurality of said semiconductor wafer workpieces for automated movement through an implant region wherein ions of the second energy impact said workpieces as they move through said implant region.

23. The ion implantation apparatus of claim 1 wherein the energizing means comprises tank circuits that have adjustable components for maintaining resonant frequencies of the tank circuits.

24. The ion implant apparatus of claim 4 additionally comprising focusing means for creating a quadrupole field to focus the accelerated ions as they pass through the ion accelerator.

25. The apparatus of claim 7 wherein the energizing means comprises a plurality of tank circuits having inductive and capacitive components which are tuned to a resonant frequency equal to the specific frequency of the alternating electric field in the acceleration gaps.

26. The apparatus of claim 7 wherein a peak maximum accelerating potential is in a range of from 0–150 k volts and said frequency is in a range of from 3 to 30 megahertz.

27. The apparatus of claim 7 additionally comprising focusing means for creating a quadrupole field to focus the accelerated ions as they pass through the ion accelerator and further wherein a peak maximum accelerating potential is in a range of from 0–150 k volts and said frequency is in a range of from 3 to 30 megahertz.

28. The method of claim 17 wherein at a position before the ions reach the implantation station, ions are mass analyzed to select ions of a specified charge to mass ratio thereby causing the selected ions having said charge to mass ratio to impact the one or more workpieces at the implantation station with said second energy.

29. Ion implantation apparatus comprising:

an ion source for creating ions;

an electrode biased relative to the ion source at an electrostatic potential for directing a beam of the charged ions having an initial energy along a travel path away from the ion source;

means for selecting ions with a desired charge to mass ratio;

an ion accelerator positioned relative the ion source to accelerate ions emitted from the ion source and including a plurality of spaced apart accelerating electrodes which, when energized create an alternating electric field to accelerate the ions entering the ion accelerator with the initial energy in stages through a plurality of accelerating gaps between electrodes to a second energy;

energizing means coupled to the ion accelerator for applying an alternating accelerating potential of a specific frequency and controlled amplitude to each accelerating electrode of the plurality of accelerating electrodes to accelerate the ions through said plurality of accelerating gaps;

automated implantation means for positioning one or more semiconductor wafer workpieces within a process chamber so that charged ions accelerated to the second energy impact said one or more semiconductor wafer workpieces; and control means coupled to the energizing means to control the relative amplitude and phase of the electric fields in the accelerating gaps.

30. The ion implantation apparatus of claim 29 additionally comprising focusing means for creating a quadrupole field to focus the accelerated ions as they pass through the ion accelerator.

31. The ion implantation apparatus of claim 29 additionally comprising an analyzing means for bending ions having a predetermined charge to mass ratio to an implantation travel path.

32. The apparatus of claim 29 wherein the energizing means comprises a plurality of tank circuits having inductive and capacitive components which are tuned to a resonant frequency equal to the specific frequency of the alternating electric field in the acceleration gaps.

* * * * *